United States Patent
Wang et al.

(10) Patent No.: US 10,459,266 B2
(45) Date of Patent: Oct. 29, 2019

(54) DISPLAY MODULE, DISPLAY APPARATUS HAVING THE SAME, AND FABRICATING METHOD THEREOF

(71) Applicant: BOE TECHNOLOGY GROUP CO., LTD., Beijing (CN)

(72) Inventors: Zifeng Wang, Beijing (CN); Yan Ren, Beijing (CN); Lei Cao, Beijing (CN); Nannan Hu, Beijing (CN); She Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 286 days.

(21) Appl. No.: 15/543,555

(22) PCT Filed: Aug. 4, 2016

(86) PCT No.: PCT/CN2016/093221
§ 371 (c)(1),
(2) Date: Jul. 13, 2017

(87) PCT Pub. No.: WO2018/023546
PCT Pub. Date: Feb. 8, 2018

(65) Prior Publication Data
US 2018/0329254 A1 Nov. 15, 2018

(51) Int. Cl.
*G02F 1/1333* (2006.01)
*G02F 1/1335* (2006.01)
*H05K 5/03* (2006.01)

(52) U.S. Cl.
CPC .. *G02F 1/133308* (2013.01); *G02F 1/133528* (2013.01); *H05K 5/03* (2013.01);
(Continued)

(58) Field of Classification Search
None
See application file for complete search history.

(56) References Cited

U.S. PATENT DOCUMENTS 5,394,306 A * 2/1995 Koenck .................. H02B 1/48
174/544
5,613,237 A * 3/1997 Bent ...................... H04B 1/086
220/4.02
(Continued)

FOREIGN PATENT DOCUMENTS

CN 202472185 U 10/2012
CN 103187009 A 7/2013
(Continued)

OTHER PUBLICATIONS

International Search Report & Written Opinion dated Apr. 27, 2017, regarding PCT/CN2016/093221.
(Continued)

*Primary Examiner* — Xanthia C Cunningham
(74) *Attorney, Agent, or Firm* — Intellectual Valley Law, P.C.

(57) ABSTRACT

The present application discloses a display module including a display substrate having a display area and a peripheral area surrounding the display area; a packaging cover facing the display substrate; and a mold frame having a frame shape and configured to receive the display substrate and the packaging cover. In the present display module, the mold frame includes a main body and a protrusion protruding away from an inner surface of the mold frame, the protrusion is between the display substrate and the packaging cover; the packaging cover has a recess in an area corresponding to the protrusion for receiving the protrusion; the recess and the protrusion complementarily match each other; and the protrusion has a first surface abutting the peripheral area of the display substrate and a second surface opposite to the first surface, the second surface abutting a surface of the recess.

17 Claims, 6 Drawing Sheets

(52) U.S. Cl.
CPC ............ *G02F 2001/133314* (2013.01); *G02F 2001/133331* (2013.01); *G02F 2001/133388* (2013.01); *G02F 2202/28* (2013.01)

(56) References Cited

U.S. PATENT DOCUMENTS

| | | | | |
|---|---|---|---|---|
| 6,532,152 | B1* | 3/2003 | White | G02F 1/133308 361/692 |
| 6,777,621 | B2* | 8/2004 | Ishikawa | G09F 9/30 174/254 |
| 8,223,297 | B2* | 7/2012 | Kim | B29C 45/14065 349/187 |
| 8,238,087 | B2* | 8/2012 | McClure | G06F 1/1613 361/679.26 |
| 8,339,537 | B2* | 12/2012 | Bo | G02F 1/133308 349/58 |
| 8,749,732 | B2* | 6/2014 | Ji | G02B 6/0085 349/58 |
| 8,830,665 | B2* | 9/2014 | Lynch | H05K 5/0086 264/272.11 |
| 9,128,666 | B2* | 9/2015 | Werner | G06F 1/1626 |
| 9,185,816 | B2* | 11/2015 | Pakula | G06F 1/1626 |
| 9,235,240 | B2* | 1/2016 | Pakula | G06F 1/1626 |
| 9,323,089 | B1 | 4/2016 | Yang et al. | |
| 10,064,294 | B2* | 8/2018 | Lee | H05K 5/02 |
| 2005/0062902 | A1* | 3/2005 | Fukayama | G02F 1/133308 349/58 |
| 2005/0285991 | A1* | 12/2005 | Yamazaki | G02F 1/133308 349/58 |
| 2007/0030436 | A1* | 2/2007 | Sasabayashi | G02F 1/1339 349/153 |
| 2007/0222917 | A1* | 9/2007 | Ono | G02F 1/133308 349/65 |
| 2008/0055518 | A1* | 3/2008 | Jung | G02B 6/0055 349/67 |
| 2009/0002930 | A1* | 1/2009 | Nakanishi | G06F 1/1616 |
| 2009/0147174 | A1* | 6/2009 | Ha | G02F 1/133606 349/58 |
| 2011/0136553 | A1* | 6/2011 | Jo | G06F 1/1656 455/575.3 |
| 2011/0267833 | A1* | 11/2011 | Verrat-Debailleul | B32B 17/10036 362/545 |
| 2012/0118628 | A1* | 5/2012 | Pakula | G06F 1/1626 174/520 |
| 2012/0182493 | A1* | 7/2012 | Hwang | G02F 1/133308 349/58 |
| 2012/0281381 | A1* | 11/2012 | Sanford | G06F 1/1626 361/807 |
| 2013/0016311 | A1* | 1/2013 | Ishii | G02F 1/133308 349/96 |
| 2013/0170115 | A1 | 7/2013 | Jung et al. | |
| 2013/0170116 | A1 | 7/2013 | In et al. | |
| 2013/0210504 | A1* | 8/2013 | Mareno | H04M 1/026 455/575.8 |
| 2014/0036458 | A1 | 2/2014 | Sato et al. | |
| 2014/0104512 | A1 | 4/2014 | Huang et al. | |
| 2014/0211122 | A1 | 7/2014 | Wurzel et al. | |
| 2015/0177451 | A1 | 6/2015 | Kang et al. | |
| 2015/0349289 | A1 | 12/2015 | Yu | |

FOREIGN PATENT DOCUMENTS

| | | |
|---|---|---|
| CN | 203535599 U | 4/2014 |
| CN | 104730766 A | 6/2015 |
| CN | 105093635 A | 11/2015 |
| CN | 105321979 A | 2/2016 |
| CN | 106097911 A | 11/2016 |
| CN | 205881372 U | 1/2017 |

OTHER PUBLICATIONS

First Office Action in the Chinese Patent Application No. 201610633060.6, dated Jul. 4, 2018; English translation attached.

First Office Action in the Korean Patent Application No. 20177021339, dated May 20, 2018; English translation attached.

* cited by examiner

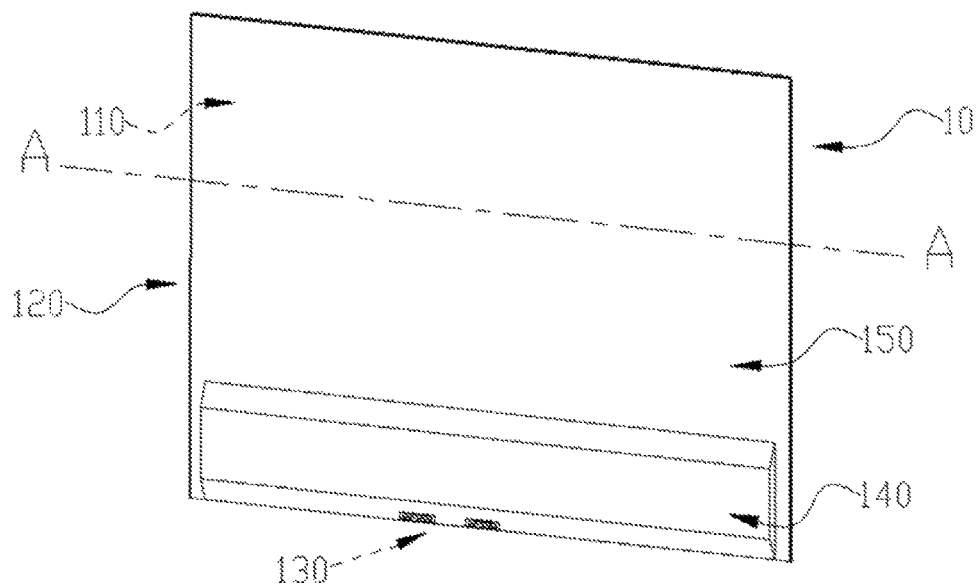
FIG. 1(*Related Art*)
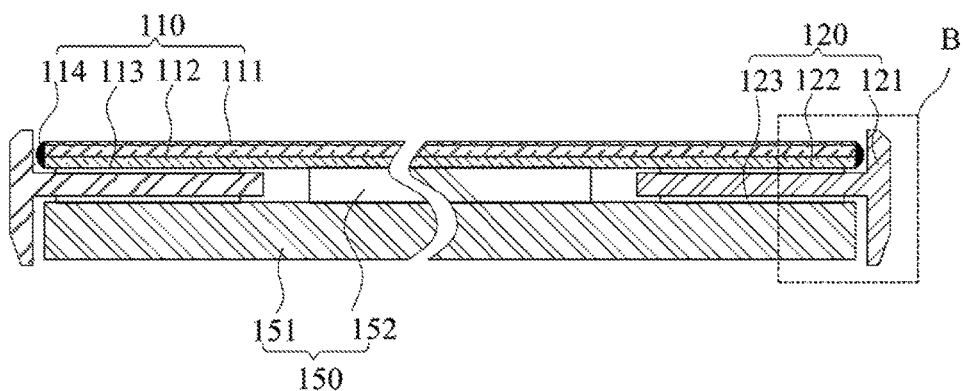
FIG. 2(*Related Art*)

DISPLAY MODULE, DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/093221 filed Aug. 4, 2016, the contents of which are incorporated by reference in the entirety.

TECHNICAL FIELD

The present invention relates to display technology, more particularly, to a display module, a display apparatus having the same, and a fabricating method thereof.

BACKGROUND

Display module is the key component of many electronic products. Liquid crystal display module and organic light emitting display module have been widely utilized in many electronic products. In particular, the thickness of an organic light emitting display module is about the same as the thickness of a display apparatus having the same. Therefore, assembly structure and thickness of the display module directly affect the appearance of the electronic products.

SUMMARY

In one aspect, the present invention provides a display module comprising a display substrate having a display area and a peripheral area surrounding the display area; a packaging cover facing the display substrate; and a mold frame having a frame shape and configured to receive the display substrate and the packaging cover, in which the mold frame comprises a main body and a protrusion protruding away from an inner surface of the mold frame, the protrusion is between the display substrate and the packaging cover; the packaging cover has a recess in an area corresponding to the protrusion for receiving the protrusion; the recess and the protrusion complementarily match each other; and the protrusion has a first surface abutting the peripheral area of the display substrate and a second surface opposite to the first surface, the second surface abutting a surface of the recess.

Optionally, the protrusion partitions the inner surface into a first portion and a second portion; the display module further comprising a sealant between the first portion of the inner surface and the display substrate, and a sealant between the second portion of the inner surface and the packaging cover, for sealing the display substrate and the packaging cover together and encapsulating display elements therebetween.

Optionally, an inner cover surface of the packaging cover abuts an inner substrate surface of the display substrate facing the inner cover surface; the inner cover surface and a surface of the recess are connected through a side surface of the recess.

Optionally, the first surface of the protrusion is substantially level with the inner cover surface of the packaging cover.

Optionally, the inner substrate surface is adhered to the first surface of the protrusion and the inner cover surface by an adhesive, and the second surface of the protrusion is adhered to the packaging cover by an adhesive.

Optionally, the protrusion has a third surface connecting the first surface and the second surface, the third surface facing the side surface of the recess and configured to, form a gap therebetween.

Optionally, the display module further comprises a printed circuit board assembly in a printed circuit board assembly area corresponding to an area within the peripheral area; the printed circuit board assembly comprises a printed circuit board abutting the inner substrate surface, a flexible connector, and an interface; a maximum thickness of the display module in the printed circuit board assembly area is no more than a maximum thickness of the display module in areas other than the printed circuit board assembly area.

Optionally, the packaging cover has a cut-out section corresponding to the printed circuit board assembly area.

Optionally, the display module further comprises a back cover on a side of the printed circuit board assembly distal to the display substrate.

Optionally, the maximum thickness of the display module in areas other than the printed circuit board assembly area is defined by a maximum thickness of the mold frame along a direction substantially perpendicular to the first surface and the second surface of the protrusion.

Optionally, the display module further comprises a circular polarizer on a side of the display substrate distal to the packaging cover.

Optionally, a maximum thickness of display module in an area corresponding to the display area is substantially the same as a sum of thicknesses of the display substrate, the packaging cover, and the circular polarizer.

In another aspect, the present invention provides a method of fabricating a display module comprising providing a mold frame comprising a main body and a protrusion protruding away from an inner surface of the mold frame; providing a packaging cover having a recess complementary to the protrusion; providing a display substrate having a display area and a peripheral area surrounding the display area; and assembling the mold frame, the packaging cover, and the display substrate so that the protrusion is sandwiched by the display substrate and the packaging cover, and the recess and the protrusion complementarily match each other.

Optionally, the display substrate, the packaging cover, and the mold frame are assembled together so that the protrusion has a first surface abutting the peripheral area of the display substrate and a second surface opposite to the first surface, the second surface abutting a surface of the recess.

Optionally, the step of assembling the mold frame, the packaging cover, and the display substrate comprises adhering a first surface of the protrusion onto the peripheral area of the display substrate, to receive the display substrate in the mold frame; adhering a second surface of the protrusion onto the surface of the recess, to receive the packaging cover in the mold frame, and to receive the protrusion in the recess; the second surface opposite to the first surface; and adhering an inner cover surface of the packaging cover onto an inner substrate surface of the display substrate facing the inner cover surface; the inner cover surface and a surface of the recess are connected through a side surface of the recess.

Optionally, subsequent to the assembling step, the method further comprises encapsulating display elements between the display substrate and the packaging cover by sealing a space formed among the mold frame, the display substrate, and the packaging cover.

Optionally, the protrusion partitions the inner surface into a first portion and a second portion; wherein the encapsulating step comprises sealing a gap between the first portion of the inner surface and the display substrate and sealing a gap between the second portion of the inner surface and the packaging cover.

Optionally, the method further comprises attaching a printed circuit board assembly in a printed circuit board assembly area corresponding to an area within the peripheral area.

Optionally, the method further comprises fabricating the packaging cover having the recess complementary to the protrusion and a cut-out portion corresponding to the printed circuit board assembly area.

In another aspect, the present invention provides a display apparatus comprising a display module described herein or fabricated by a method described herein.

BRIEF DESCRIPTION OF THE FIGURES

The following drawings are merely examples for illustrative purposes according to various disclosed embodiments and are not intended to limit the scope of the present invention.

FIG. 1 is a diagram illustrating the structure of a conventional display module.

FIG. 2 is a cross-sectional view along the A-A direction of the display module in FIG. 1.

DETAILED DESCRIPTION

Figure 3:
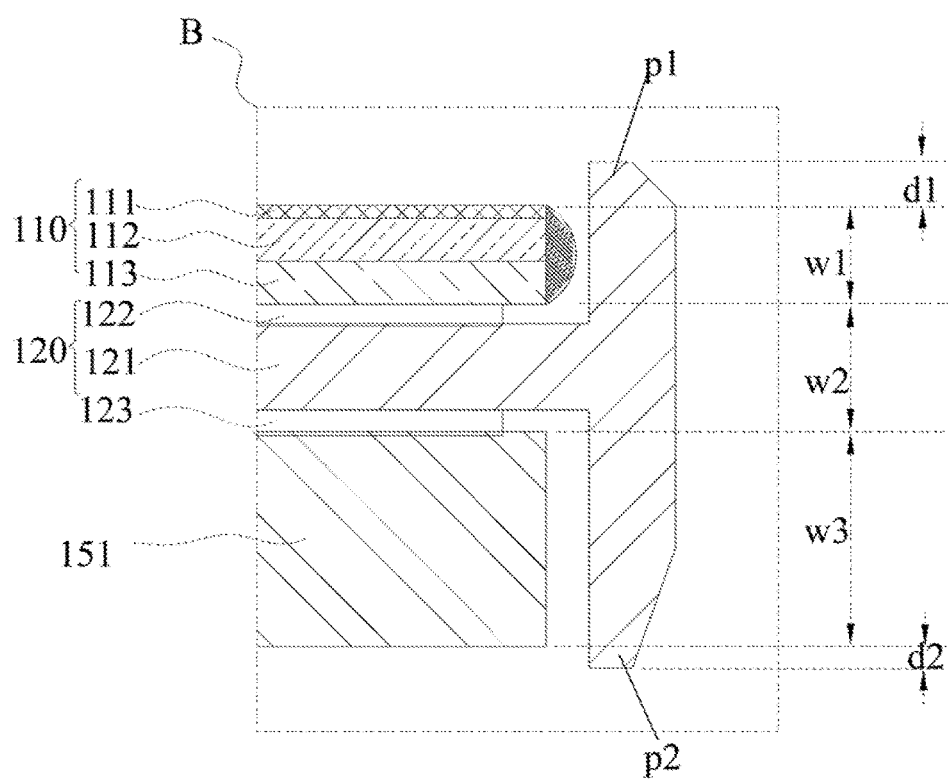
FIG. 3 is a zoom-in view of the section B of the display module in FIG. 2.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In one aspect, the present disclosure provides an ultrathin display module, an ultrathin display apparatus having the same, and a fabricating method thereof. In some embodiment, the present ultrathin display module includes a display substrate having a display area and a peripheral area surrounding the display area; a packaging cover facing the display substrate; and a mold frame having a frame shape and configured to receive the display substrate and the packaging cover. Optionally, in the present display module, the mold frame includes a main body and a protrusion protruding away from an inner surface of the mold frame, the protrusion is between the display substrate and the packaging cover; the packaging cover has a recess in an area corresponding to the protrusion for receiving the protrusion; the recess and the protrusion complementarily match each other; and the protrusion has a first surface abutting the peripheral area of the display substrate and a second surface opposite to the first surface, the second surface abutting a surface of the recess.

Various appropriate materials may be used for making the packaging cover, examples of which include, but are not limited to, glass, metals, and a combination thereof. In a display apparatus, packaging cover is used for encapsulating display elements of the display panel in a sealed space between a packaging cover and, e.g., a display substrate to insulate the display elements therein from external environmental damages caused by moist and oxygen. As such, the packaging cover often has a size and shape substantially corresponding to that of the display substrate so that substantially all display elements may be encapsulated. Typically, the packaging cover is made of relatively rigid materials to protect the display elements from external physical damages. A back plate is typically used as a support for the display apparatus, and sometimes as an aesthetic component of the display apparatus, e.g., as a cover for any exposed printed circuit boards or outlets. Various appropriate materials may be used for making a back plate, typically a light weight material such as plastics or other polymers. Various appropriate shapes and sizes may be used for making a back plate. For example, the back plate often has a non-flat surface contour in order to cover a printed circuit board attached to the display apparatus. It is not required for a black plate to form a sealed space in the display apparatus.

FIG. 1 is a diagram illustrating the structure of a conventional display module. FIG. 1 shows a back side of the display module, i.e., the light emitting side of the display module faces away from the viewer. Referring to FIG. 1, the conventional display module 10 includes a display screen assembly 110, a mold frame 120 for assembling and protecting the display module 10, a printed circuit board assembly 130, a back cover 140 covering the printed circuit board assembly 130, and a back plate 150 for supporting the entire display module. The printed circuit board assembly 130 is attached onto the back plate 150, resulting in a printed circuit board assembly bulging outwards from the display module. Thus, the display module has a non-uniform thickness. Packaging of the display module for shipping or transportation has to be designed in order to hold and secure the printed circuit board assembly 130 in place.

FIG. 2 is a cross-sectional view along the A-A direction of the display module in FIG. 1. Referring to FIG. 2, the conventional display module includes a display screen assembly 110, a mold frame assembly 120, and a back plate assembly 150. The display screen assembly 110 includes a circular polarizer 111, a display substrate 112, a packaging cover 113, and a sealant 114 for sealing the display screen assembly 110 The mold frame assembly 120 includes a mold frame 121, and adhesive layers 122 and 123. The back plate assembly 150 includes a back plate 151 and an ancillary layer 152 for adhering the back plate 151 and heat insulation.

FIG. 3 is a zoom-in view of the section B of the display module in FIG. 2. Referring to FIG. 3, the maximum thickness of the display module is defined by a maximum thickness of the mold frame along a direction substantially perpendicular to the display substrate 112. The mold frame is thicker than the rest of the display module on both sides of the display module by having a protrusion on each side. Along the direction substantially perpendicular to the display substrate 112, the mold frame has a protrusion p1 protruding outwards on one end of the mold frame and a protrusion p2 protruding outwards on the other end of the mold frame. As shown in FIG. 3, the maximum thickness of the display module is a sum of d1, w1, w2, w3, and d2, wherein w1 is the thickness of the display screen assembly 110, w2 is the thickness of the mold frame assembly 120, w3 is the thickness of the back plate 151, d1 is the additional thickness of the mold frame protruding outwards on one end of the mold frame, and d2 is the additional thickness of the mold frame protruding outwards on the other end of the mold frame.

The present disclosure provides an ultrathin display module having a novel assembly structure. The overall thickness of the present display module may be made much smaller than that of the conventional display module. As compared to the conventional display module, the present display module does not require (e.g., does not include) a back plate. The elimination of a back plate in the present display module results in a superior assembly structure. Moreover, the printed circuit board assembly may be internalized inside the display module rather than disposed externally to the display module, resulting in a uniform thickness throughout the entire display module.

Figure 4:
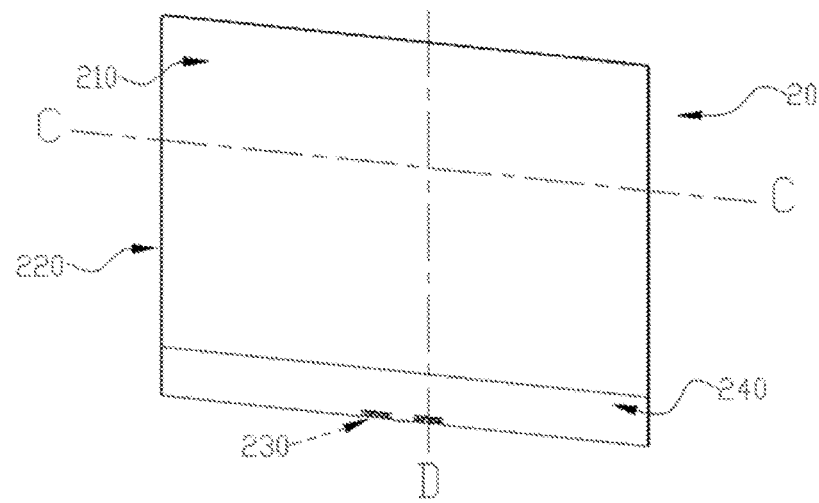
FIG. 4 is a diagram illustrating the structure of a display module in some embodiments.

FIG. 4 is a diagram illustrating the structure of a display module in same embodiments. FIG. 4 shows a back side of the display module, the light emitting side of the display module faces away from the viewer. Referring to FIG. 4, the display module 20 in the embodiment includes a display screen assembly 210, a mold frame 220 for assembling and protecting the display screen assembly 210, a printed circuit board assembly 230, and a back cover 240 covering the printed circuit board assembly 230. As discussed above, the printed circuit board assembly in the conventional display module is attached onto the display module external to the display screen assembly, resulting in a printed circuit board assembly bulging outwards from the display module. In contrast, the printed circuit board assembly 230 in the present display module is internalized inside the display screen assembly, resulting in a substantially uniform thickness throughout the entire display module 20.

Figure 5:
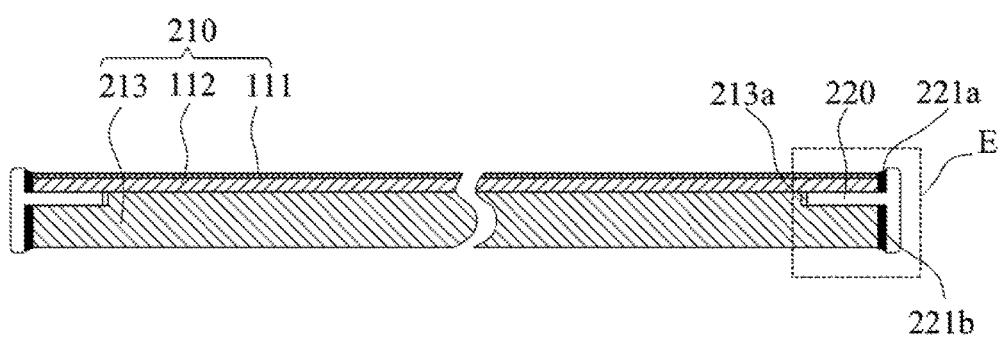
FIG. 5 is a cross-sectional view along the C-C direction of the display module in FIG. 4.

FIG. 5 is a cross-sectional view along the C-C direction of the display module in FIG. 4. As shown in FIG. 5, the present display module has at least one less layer as compared to a conventional display module. Far example, the display module as shown in FIG. 4 has a three-layer structure including a circular polarizer 111, a display substrate 112, and a packaging cover 213, all of which are received and secured together by a mold frame 220. In contrast, the display screen assembly in the conventional display module has a four-layer structure including a circular polarizer, a display substrate, a packaging cover, and a back plate (see, FIG. 2). The mold frame in the conventional display module is disposed between the packaging cover and the back plate whereas the mold frame 220 in the present display module is between the display substrate 112 and the packaging cover 213. Thus, the present disclosure provides an ultrathin display module having a novel assembly structure.

Referring to FIG. 5, the packaging cover 213 and the display substrate 112 in the display module face each other, i.e., their inner surfaces abut each other. Optionally, their inner surfaces may be adhered together by an adhesive (e.g., a glue). The display substrate 112 includes a display area and a peripheral area surrounding the display area (see, e.g., the area corresponding to section E in FIG. 5). The mold frame 229 and other components such as a printed circuit board assembly are disposed in an area corresponding to the peripheral area. The mold frame 220 has a frame shape and is configured to receive both the display substrate 112 and the packaging cover 213. Optionally, the mold frame 220 is configured to receive additional layers of the display module such as a circular polarizer 111.

Figure 6A:
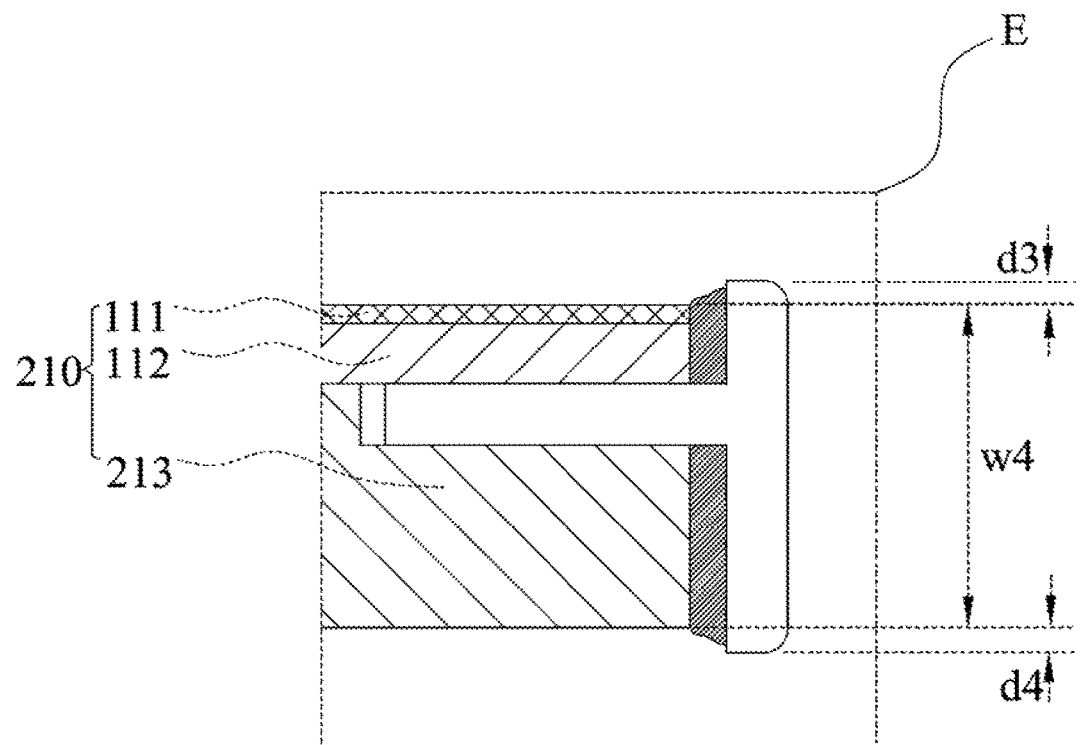
FIG. 6A is a zoom-in view of the section E of the display module in FIG. 5.
Figure 6B:
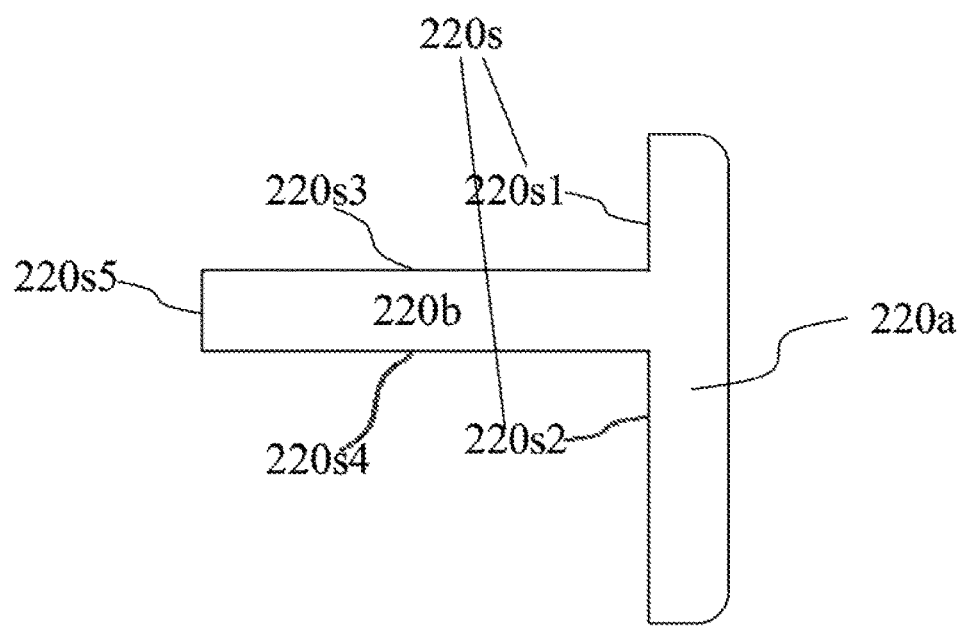
FIG. 6B is a diagram illustrating the structure of a mold frame in some embodiments.

FIG. 6B is a diagram illustrating the structure of a mold frame in some embodiments. Referring to FIG. 6B, the mold frame in the embodiment includes a main body 220a and a protrusion 220b protruding away from an inner surface 220s of the mold, frame 220. The protrusion 220b partitions the inner surface 220s into a first portion 220s1 and a second portion 220s2. The protrusion 220b has a first surface 220s3, a second surface 220s4 opposite to the first surface 220s3, and a third surface 220s5 connecting the first surface 220s3 and the second surface 220s4. The mold frame (including the protrusion 220b) is disposed in an area corresponding to the peripheral area (e.g., the area corresponding to section E in FIG. 5). Thus, as shown in FIG. 5, the first surface 229s3 of the protrusion 229b abuts the peripheral area of the display substrate 112, and the second surface 220s4 of the protrusion 220b abuts the bottom surface 213s1 of the recess 213r (see, e.g., FIG. 5 and FIG. 6A). The protrusion 220b is between the display substrate 112 and the packaging cover 213.

In some embodiments, the mold frame 220, the display substrate 112, and the packaging cover 213 are dimensioned such that there are small gaps among these components (prior to sealing). Some of these gaps are to be sealed using a sealant, others may be used as reservoir for holding excess glue during the assembling process. Referring to FIG. 5, the mold frame 220, the display substrate 112, and the packaging cover 213 may be dimensioned such that there are three gaps among these components, i.e., 213a, 221a, and 221b. The gaps 221a and 221b are to be sealed using a sealant, and the gap 213a may be a reservoir for holding excess glue during the process of adhering the mold frame 220, the display substrate 112, and the packaging cover 213 together.

In some embodiments, the maximum thickness of the display module is defined by a maximum thickness of the mold frame along a direction substantially perpendicular to the first surface and the second surface of the protrusion. FIG. 6A is a zoom-in view of the section E of the display module in FIG. 5. As shown in FIG. 6A, the maximum thickness of the display module is a sum of d3, w4, and d4, wherein w4 is the thickness of the display screen assembly 210, d3 is the additional thickness of the mold frame protruding outwards on one end of the main body, and d4 is the additional thickness of the mold frame protruding outwards on the other end of the main body. In contrast, the conventional display module as shown in FIG. 3 includes at least five layers in the peripheral area of the display module, including a circular polarizer 111, a display substrate 112, a packaging cover 113, a mold frame 120, a back plate 151. In contrast, the display module in FIG. 6A includes a circular polarizer 111, a display substrate 112, a mold frame 120, and a packaging cover 113. Thus, the thickness of the present display module may be significantly decreased due to the absence of a back plate having a thickness w3. Optionally, the packaging cover 113 in the present display module may be made thicker than that of the conventional display module for providing a stronger support. Nonetheless, the overall thickness of the present display module may still be made smaller than that of the conventional display module, achieving an ultrathin display module.

Figure 6C:
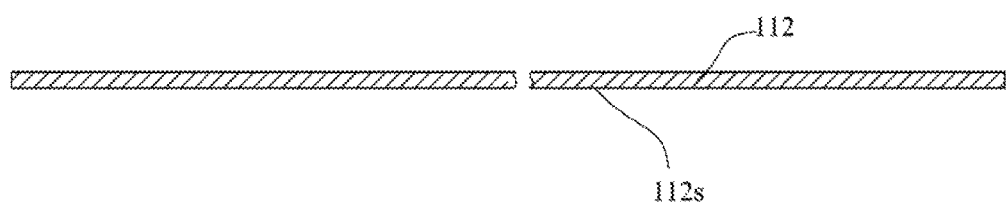
FIG. 6C is a diagram illustrating the structure of a display substrate in some embodiments.
Figure 6D:
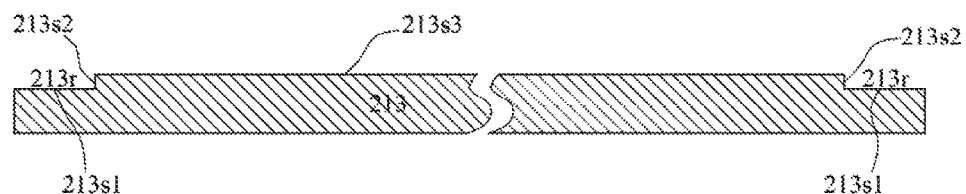
FIG. 6D is a diagram illustrating the structure of a packaging cover in some embodiments.

FIG. 6C is a diagram illustrating the structure of a display substrate in some embodiments. FIG. 6D is a diagram illustrating the structure of a packaging cover in some embodiments. Referring to 6C and 6D, the display substrate 112 has an inner substrate surface 112s facing the packaging cover 213, and the packaging cover 213 has an inner cover surface 213s3 facing the display substrate 112. The inner cover surface 213s3 of the packaging cover 213 and the inner substrate surface 112s of the display substrate 112 abut each other. For example, the inner cover surface 213s3 of the packaging cover 213 and the inner substrate surface 112s of the display substrate 112 may be adhered to each other, e.g., by an adhesive such as a glue.

Further, as shown in FIG. 6D, the packaging cover 213 has a recess 213r in an area corresponding to the protrusion 220b for receiving the protrusion 220b. The recess 213r and the protrusion 220b complementarily match each other. The recess 213r has a bottom surface 213s1 and a side surface 213s2, the side surface 213s2 of the recess 213r connects the inner cover surface 213s3 of the packaging cover 213 with the bottom surface 213s1 of the recess 213r (see, e.g., FIG. 5 and FIG. 6A).

In some embodiments, the protrusion 220b and the recess 213r are dimensioned such that the first surface 220s3 of the protrusion 220b is substantially level with the inner cover surface 213s3 of the packaging cover 213. By having this design, the protrusion 220b and the packaging cover 213 form a substantially even surface, facilitating adhesion of the display substrate 112 onto the packaging cover 213. Optionally, any minor unevenness between the first surface 220s3 of the protrusion 220b and the inner cover surface 213s3 of the packaging cover 213 may be planarized by an adhesive such as a glue. Optionally, the second surface 220s4 of the protrusion 220b may be adhered to the bottom surface 213s1 of the recess 213r, e.g., by an adhesive such as a glue.

Referring to FIG. 6A-D, the protrusion 220b has a third surface 220s5 connecting the first surface 220s3 and the second surface 220s4, and the third surface 220s5 of the protrusion 220b faces the side surface 213s2 of the recess 213r when the display module is assembled. As shown in FIG. 6A, the third surface 220s5 of the protrusion 220b is configured to form a gap (corresponding to 213a in FIG. 5) between the third surface 220s5 of the protrusion 220b and the side surface 213s2 of the recess 213r. By having this design, the gap may receive any excess glue during display screen assembling process, e.g., a process of adhering the display substrate 112 onto the packaging cover 213 and the mold frame 220.

The present display module utilizes the mold frame 220 as a support structure for encapsulating display elements (e.g., light emitting diodes) of the display module. As shown in FIG. 5, the display module includes a sealant filling in and sealing a gap 221a between the first portion of inner surface (220s1 in FIG. 6B) and the display substrate 112, and a sealant filling in and sealing a gap 221b between the second portion of inner surface (220s2 in FIG. 6B) and the packaging cover 213. The sealants in 221a and 221b seal the display substrate 112 and the packaging cover 213 together, and encapsulate the display elements of the display module between the display substrate 112 and the packaging cover 213.

Figure 7:
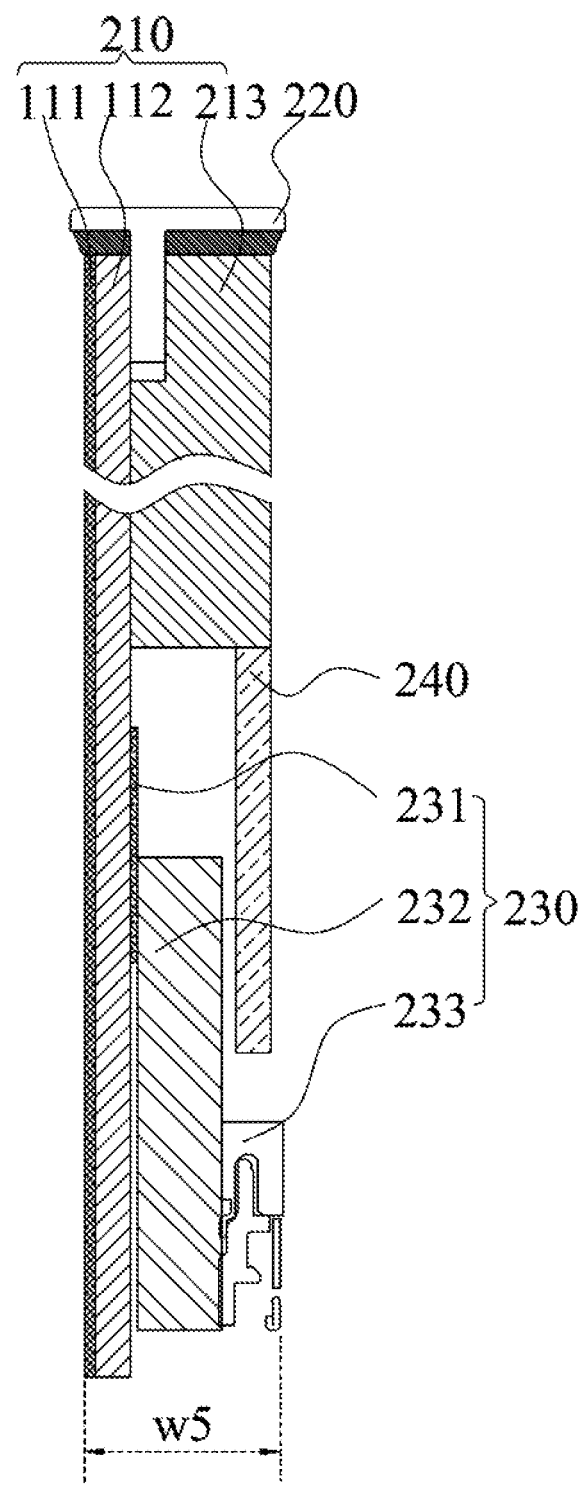
FIG. 7 is a cross-sectional view along the D-D direction of the display module in FIG. 4.

FIG. 7 is a cross-sectional view along the D-D direction of the display module in FIG. 4. Referring to FIG. 7, the display module in the embodiment includes a printed circuit board assembly 230 in a printed circuit board assembly area. The printed circuit board assembly area is within the peripheral area of the display module. The printed circuit board assembly 230 includes a printed circuit board 232 abutting the inner substrate surface of the display substrate 112, a flexible connector 231, and an interface 233. Thus, within the printed circuit board assembly area, the display module includes the printed circuit board assembly 230 in lieu of the packaging cover 213.

In some embodiments, a maximum thickness of the display module in the printed circuit board assembly area is no more than a maximum thickness of the display module in areas other than the printed circuit board assembly area. As shown in FIG. 7, the display module in the printed circuit board assembly area has a maximum thickness w5, which is a sum of the thicknesses of the display substrate 112, the flexible connector 231, the printed circuit board 232, and the interface 233. Optionally, w5 is no more than the sum of d3, d4, and w4. By having this design, the display module may be made to have a substantially uniform thickness throughout the entire display module.

In some embodiments, the printed circuit board assembly 230 in the present display module has a maximum thickness no more than a maximum thickness of the packaging cover 213.

As shown in FIG. 4 and FIG. 7, the display module in the embodiment may further include a back cover 240 covering the printed circuit board assembly 230 except for an area corresponding to the interface 233. The back cover 240 may be attached to the display module by, e.g., an adhesive, a snap hook, a magnet, a double-sided adhesive tape, etc.

In some embodiments, the external surface of the back cover 240 is substantially level with the external surface of the packaging cover 213.

In some embodiments, the packaging cover of the present display module may be used directly as an appearance part of the display module. Optionally, the surface of the packaging cover may be treated to include a surface finish layer, and the surface treated packaging cover is used as an appearance part of the display module.

Optionally, the display module is an organic light emitting display module.

In another aspect, the present disclosure provides a method of fabricating a display module. In some embodiments, the method includes providing a mold frame having a main body and a protrusion protruding away from an inner surface of the mold frame; providing a packaging cover having a recess complementary to the protrusion; providing a display substrate having a display area and a peripheral area surrounding the display area; and assembling the display substrate and the packaging cover together using the mold frame as a support. For example, the method may include assembling the mold frame, the packaging cover, and the display substrate so that the protrusion is sandwiched by the display substrate and the packaging cover, and the recess and the protrusion complementarily match each other. Optionally, the display substrate, the packaging cover, and the mold frame are assembled together so that the protrusion has a first surface abutting the peripheral area of the display substrate and a second surface opposite to the first surface, the second surface abutting a bottom surface of the recess.

In some embodiments, the method further includes fabricating a mold frame having a main body and a protrusion protruding away from an inner surface of the mold frame. Specifically, the mold frame fabricated according to the present method includes a protrusion that partitions the inner surface of the mold frame into a first portion and a second portion. The protrusion has a first surface, a second surface opposite to the first surface, and a third surface connecting the first surface and the second surface. When the display module is assembled, the mold frame (including the protrusion) is disposed in an area corresponding to the peripheral area. The first surface of the protrusion abuts the peripheral area of the display substrate, and the second surface of the protrusion abuts the bottom surface of the recess. The protrusion is between the display substrate and the packaging cover.

In some embodiments, the method further includes fabricating a packaging cover having a recess complementarily matching the protrusion. Optionally, the packaging cover fabricated according to the present method includes a recess in an area corresponding to the protrusion for receiving the protrusion. When the display module is assembled, the recess and the protrusion complementarily match each other. The recess has a bottom surface and a side surface, the side surface of the recess connects the inner cover surface of the packaging cover with the bottom surface of the recess. In a display module fabricated according to the present method, the display substrate has an inner substrate surface facing the packaging cover, and the packaging cover has an inner cover surface facing the display substrate. The inner cover surface of the packaging cover and the inner substrate surface of the display substrate abut each other. For example, the inner cover surface of the packaging cover and the inner substrate surface of the display substrate may be adhered to each other, e.g., by an adhesive such as a glue.

In some embodiments, the display substrate, the packaging cover, and the mold frame are assembled together by adhering these components together. Specifically, the method includes adhering a first surface of the protrusion onto the peripheral area of the display substrate, to receive the display substrate in the mold frame; adhering a second surface of the protrusion onto the bottom surface of the recess, to receive the packaging cover in the mold frame, and to receive the protrusion in the recess; the second surface opposite to the first surface; and adhering an inner cover surface of the packaging cover onto an inner substrate surface of the display substrate facing the inner cover surface; the inner cover surface and a bottom surface of the recess are connected through a side surface of the recess. Optionally, one or more of the adhering steps above may be performed by, e.g., an adhesive, a double-sided adhesive tape, a glue, a magnet, etc.

Subsequent to the assembling step, the fabricating method optionally further includes encapsulating display elements between the display substrate and the packaging, cover by sealing a space formed among the mold frame, the display substrate, and the packaging cover. Because the present method uses a mold frame as the support structure, the encapsulating step may be performed by sealing any gap between the mold frame and the display substrate and sealing any gap between the mold frame and the packaging cover, thereby encapsulating display elements between the display substrate and the packaging cover. Specifically, the encapsulating step may include sealing a gap between the first portion of the inner surface and the display substrate and sealing a gap between the second portion of the inner surface and the packaging cover. Any appropriate sealant may be used for sealing a space formed among the mold frame, the display substrate, and the packaging cover. Examples of sealants include a UV curable sealant (e.g., an epoxy resin), a low-temperature heat curable sealant, and a laser curable sealant.

In some embodiments, the method further includes attaching a printed circuit board assembly in a printed circuit board assembly area corresponding to an area within the peripheral area. Optionally, the printed circuit board assembly includes a printed circuit board abutting the inner substrate surface, a flexible connector, and an interface.

Subsequent to the attachment of the printed circuit board assembly in a printed circuit board assembly area, a maximum thickness of the display module in the printed circuit board assembly area is no more than a maximum thickness of the display module in areas other than the printed circuit board assembly area.

In some embodiments, the method further includes fabricating the printed circuit board assembly, e.g., a printed circuit board assembly including a printed circuit board abutting the inner substrate surface, a flexible connector, and an interface. Optionally, the printed circuit board assembly in the printed circuit board assembly area has a maximum thickness no more than a maximum thickness of the packaging cover.

In some embodiments, the method further includes fabricating a packaging cover having a recess complementarily matching the protrusion and a cut-out portion corresponding to the printed circuit board assembly area.

In some embodiments, the method further includes attaching a back cover on a side of the printed circuit board distal to the display substrate. The back cover may be attached to the display module by, e.g., an adhesive, a snap hook, a magnet, a double-sided adhesive tape, etc. Optionally, the back cover covers the printed circuit board assembly except for an area corresponding to the interface. In some embodiments, the external surface of the back cover is substantially level with the external surface of the packaging cover.

In some embodiments, the method further includes fabricating a back cover.

In some embodiments, the method further includes adhering a circular polarizer onto the display substrate on a side distal to the packaging cover. Optionally, when a circular polarizer is included in the display module, the maximum thickness of display module in an area corresponding to the display area is substantially the same as a sum of thicknesses of the display substrate, the packaging cover, and the circular polarizer.

In another aspect, the present disclosure provides an ultrathin display apparatus having an ultrathin display module described herein or manufactured by a method described herein. In some embodiments, the display apparatus is an organic light emitting display apparatus. Examples of display apparatuses include, but are not limited to, an electronic paper, a mobile phone, a tablet computer, a television, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element.

Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display module, comprising: a display substrate having a display area and a peripheral area surrounding the display area; a packaging cover facing the display substrate; and a mold frame configured to receive the display substrate and the packaging cover; wherein the mold frame comprises a main body and a protrusion protruding away from an inner surface of the mold frame, the protrusion is between the display substrate and the packaging cover; the packaging cover has a recess in an area corresponding to the protrusion for receiving the protrusion; the recess and the protrusion complementarily match each other; and the protrusion has a first surface abutting the peripheral area of the display substrate and a second surface opposite to the first surface, the second surface abutting a surface of the recess; wherein the protrusion partitions the inner surface into a first portion and a second portion; the display module further comprising: a sealant between the first portion of the inner surface and the display substrate, and a sealant between the second portion of the inner surface and the packaging cover, for sealing the display substrate and the packaging cover together and encapsulating display elements therebetween.

2. The display module of claim 1, wherein an inner cover surface of the packaging cover abuts an inner substrate surface of the display substrate facing the inner cover surface; the inner cover surface and a surface of the recess are connected through a side surface of the recess.

3. The display module of claim 2, wherein the first surface of the protrusion is substantially level with the inner cover surface of the packaging cover.

4. The display module of claim 2, wherein the inner substrate surface is adhered to the first surface of the protrusion and the inner cover surface by an adhesive, and the second surface of the protrusion is adhered to the packaging cover by an adhesive.

5. The display module of claim 2, wherein the protrusion has a third surface connecting the first surface and the second surface, the third surface facing the side surface of the recess and configured to form a gap therebetween.

6. The display module of claim 2, further comprising a printed circuit board assembly in a printed circuit board assembly area corresponding to an area within the peripheral area; the printed circuit board assembly comprises a printed circuit board abutting the inner substrate surface, a flexible connector, and an interface;
   a maximum thickness of the display module in the printed circuit board assembly area is no more than a maximum thickness of the display module in areas other than the printed circuit board assembly area.

7. The display module of claim 6, the packaging cover has a cut-out section corresponding to the printed circuit board assembly area.

8. The display module of claim 6, further comprising a back cover on side of the printed circuit board assembly distal to the display substrate.

9. The display module of claim 6, the maximum thickness of the display module in areas other than the printed circuit board assembly area is defined by a maximum thickness of the mold frame along a direction substantially perpendicular to the first surface and the second surface of the protrusion.

10. The display module of claim 1, further comprising a circular polarizer on a side of the display substrate distal to the packaging cover.

11. The display module of claim 10, wherein a maximum thickness of display module in an area corresponding to the display area is substantially the same, as a sum of thicknesses of the display substrate, the packaging cover, and the circular polarizer.

12. A display apparatus comprising a display module of claim 1.

13. A method of fabricating a display module, comprising: providing a mold frame comprising a main body and a protrusion protruding away from an inner surface of the mold frame; providing a packaging cover having a recess complementary to the protrusion; providing a display substrate having a display area and a peripheral area surrounding the display area; and assembling the mold frame, the packaging cover, and the display substrate so that the protrusion is sandwiched by the display substrate and the packaging cover, and the recess and the protrusion complementarily match each other; wherein the display substrate, the packaging cover, and the mold frame are assembled together so that the protrusion has a first surface abutting the peripheral area of the display substrate and a second surface opposite to the first surface, the second surface abutting a surface of the recess; wherein the step of assembling the mold frame, the packaging cover, and the display substrate comprises: adhering a first surface of the protrusion onto the peripheral area of the display substrate, to receive the display substrate in the mold frame; adhering a second surface of the protrusion onto the surface of the recess, to receive the packaging cover in the mold frame, and to receive the protrusion in the recess; the second surface opposite to the first surface; and adhering an inner cover surface of the packaging cover onto an inner substrate surface of the display substrate facing the inner cover surface; the inner cover surface and a surface of the recess are connected through a side surface of the recess.

14. The method of claim 13, subsequent to the assembling step, further comprising encapsulating display elements between the display substrate and the packaging cover by sealing a space formed among the mold frame, the display substrate, and the packaging cover.

15. The method of claim 14, wherein the protrusion partitions the inner surface into a first portion and a second portion; wherein the encapsulating step comprises sealing a gap between the first portion of the inner surface and the display substrate and sealing a gap between the second portion of the inner surface and the packaging cover.

16. The method of claim 13, further comprising attaching a printed circuit board assembly in a printed circuit board assembly area corresponding to an area within the peripheral area.

17. The method of claim 16, further comprising fabricating the packaging cover having the recess complementary to the protrusion and a cut-out portion corresponding to the printed circuit board assembly area.

* * * * *